(12) United States Patent
Mencaraglia et al.

(10) Patent No.: US 10,429,435 B2
(45) Date of Patent: Oct. 1, 2019

(54) CONTACTLESS MEASUREMENT OF THE CONDUCTIVITY OF SEMICONDUCTORS USING A MULTICARRIER FREQUENCY TEST SIGNAL

(71) Applicants: CENTRE NATIONAL DE LA RECHERCHE SCIENTIFIQUE—CNRS, Paris (FR); UNIVERSITE PARIS-SUD, Orsay (FR); ECOLE SUPERIEURE D'ELECTRICITE, Gif sur Yvette (FR)

(72) Inventors: Denis Mencaraglia, Bures sur Yvette (FR); Yann Le Bihan, Cachan (FR); Florent Loete, Massy (FR)

(73) Assignees: Centre National De La Recherche Scientifique—CNRS, Paris (FR); Universite Paris-Sud, Orsay (FR); Ecole Superieure D'Electricite, Gif sur Yvette (FR)

( * ) Notice: Subject to any disclaimer, the term of this patent is extended or adjusted under 35 U.S.C. 154(b) by 0 days.

(21) Appl. No.: 15/566,792

(22) PCT Filed: Apr. 7, 2016

(86) PCT No.: PCT/FR2016/050800
§ 371 (c)(1),
(2) Date: Oct. 16, 2017

(87) PCT Pub. No.: WO2016/166449
PCT Pub. Date: Oct. 20, 2016

(65) Prior Publication Data
US 2018/0100887 A1    Apr. 12, 2018

(30) Foreign Application Priority Data

Apr. 16, 2015 (FR) ..................... 15 53392

(51) Int. Cl.
G01R 31/265 (2006.01)
G01R 27/06 (2006.01)
(Continued)

(52) U.S. Cl.
CPC ......... G01R 31/2656 (2013.01); G01R 27/06 (2013.01); G01R 31/2648 (2013.01);
(Continued)

(58) Field of Classification Search
CPC .... G01R 31/2831; G01R 27/02; G01R 27/06; G01R 27/205; G01R 27/2658;
(Continued)

(56) References Cited

U.S. PATENT DOCUMENTS 4,286,215 A    8/1981    Miller
6,369,603 B1  4/2002    Johnston et al.
(Continued)

OTHER PUBLICATIONS

International Search Report related to Application No. PCT/FR2016/050800 dated Jul. 14, 2016.

*Primary Examiner* — Vinh P Nguyen
(74) *Attorney, Agent, or Firm* — Miller, Matthias & Hull LLP

(57) ABSTRACT

Method of contactless measurement of the conductivity of semiconductors, said method being implemented by: a first assembly comprising a signal emission/reception system —a second assembly comprising at least one semi-conducting target and an inductor element, —a third assembly, said method comprising at least the following steps: a) the first assembly emits a multifrequency signal, b) the second assembly reflects or transmits at least one part of the multifrequency signal emitted, c) the first assembly receives the reflected multifrequency signal reflected by the second assembly, d) the third assembly calculates the coefficient of reflection or of transmission of the emitted signal, e) the (Continued)

third assembly provides the conductivity of the semiconducting target.

13 Claims, 9 Drawing Sheets

(51) Int. Cl.
G01R 31/26 (2014.01)
G01R 31/311 (2006.01)
H01L 21/66 (2006.01)
G01R 31/28 (2006.01)

(52) U.S. Cl.
CPC ........ G01R 31/2831 (2013.01); G01R 31/311 (2013.01); H01L 22/14 (2013.01)

(58) Field of Classification Search
CPC .. G01R 31/302; G01R 31/308; G01R 31/311; G01R 27/26; G01R 31/04; G01R 31/26; G01R 31/2637; H01L 22/14; H01L 22/10; H01L 24/48; H01L 24/49; H01L 2924/19107; H01L 29/00; H01L 22/34; G01N 22/02; G01N 27/02; G01N 27/4166; G01B 7/003; G01B 7/02; G01B 7/06; G01B 7/13; G06F 11/008
See application file for complete search history.

(56) References Cited

U.S. PATENT DOCUMENTS

| | | | |
|---|---|---|---|
| 6,815,947 B2* | 11/2004 | Scheiner | G01B 7/105 324/229 |
| 8,633,700 B1* | 1/2014 | England | G01V 3/12 324/348 |
| 9,564,861 B2* | 2/2017 | Zhao | H03F 3/213 |
| 2004/0138838 A1 | 7/2004 | Scheiner et al. | |
| 2016/0079809 A1* | 3/2016 | Corum | H02J 5/005 307/104 |

* cited by examiner

CONTACTLESS MEASUREMENT OF THE CONDUCTIVITY OF SEMICONDUCTORS USING A MULTICARRIER FREQUENCY TEST SIGNAL

CROSS-REFERNCE TO RELATED APPLICATION

This Application is a 35 USC § 371 US National Stage filing of International Application No. PCT/FR2016/050800 filed on Apr. 7, 2016, and claims priority under the Paris Convention to French Patent Application No. 15 53392 filed on Apr. 16, 2015.

FIELD OF THE DISCLOSURE

The present invention relates to the contactless measurement of the conductivity of semiconductors.

BACKGROUND OF THE DISCLOSURE

Methods for contactless characterization of semiconductor conductivity by using a single-frequency electric signal are already known.

For example, U.S. Pat. No. 4,286,215 discloses such a method for contactless measurement of conductivity using eddy currents. This type of measurement method of the kind in question is similar to an oscillator using a single-frequency electrical signal. This type of measurement method requires making a reference measurement of the conductivity in darkness and then estimating the imbalance under modulated light. The maximum sensitivity of the conductivity measurement, for doping and for the usual thicknesses of silicon wafers, is around 13 MHz. A system using a single-frequency signal is therefore only suitable for characterization of a single type of material, within a range of thicknesses and of limited conductivity.

The present invention aims to overcome these drawbacks.

SUMMARY OF THE DISCLOSURE

To this end, the invention concerns a method of contactless measurement of the conductivity of semiconductors, said method being implemented by:
  a first assembly comprising a signal emission/reception system capable of emitting/receiving a multifrequency signal over a range of frequencies,
  a second assembly comprising at least one semiconducting target and an inductor element, the semiconducting target being positioned close to the inductor element,
  a transmission line, said transmission line being adapted to transmit the signal between the first assembly and the second assembly, and
  a third assembly, said third assembly being intended to be connected to the first assembly, the third assembly comprising an analysis system, the third assembly being adapted to analyze a signal emitted by the first assembly and a reflected or transmitted signal received by the first assembly, and the third assembly being adapted to derive therefrom a reflection or transmission coefficient of the emitted signal,
said method comprising at least the following steps:
a) the first assembly emits a multifrequency signal,
b) the second assembly reflects or transmits at least part of the multifrequency signal emitted by the first assembly,
c) the first assembly receives the multifrequency signal reflected or transmitted by the second assembly,
d) the third assembly calculates the reflection or transmission coefficient of the emitted signal for the range of frequencies,
e) the third assembly determines the conductivity of the semiconducting target.

Such a measurement method enables characterizing the conductivity of many types of materials by making measurements over a wide range of frequencies.

Such a method thus allows characterizing a wide range of semiconductors of different conductivities and different thicknesses, and possibly multi-layer semiconductors.

Furthermore, such a method enables measuring the conductivity of materials during their processing, which is particularly advantageous for carrying out systematic quality controls by a rapid method in production lines.

In various embodiments of the method according to the invention, one or more of the following may possibly be used:
  the emitted multifrequency signal is of the form:

$$x(t) = \sum_{i=1}^{N/2} a_i \cos\left(\frac{2\pi i}{NT_e}t + \varphi_i\right)$$

where i represents the index of the ith frequency, $T_e$ the sample emission period, $a_i$ the amplitude of the N/2 frequencies, and $\varphi_i$ their respective phases.
  the analysis system of the third assembly uses a model relating the variation in impedance of the second assembly to the conductivity of the target, step e) of the method comprising the following steps carried out beforehand by the third assembly:
    e1) from the value of the reflection or transmission coefficient, determine the variation in impedance of the second assembly over the range of frequencies,
    e2) with the model, deduce the conductivity of the target from the variation in impedance of the second assembly;
  the analysis system of the third assembly uses a model of the electromagnetic interaction between the inductor element and the semiconducting target and a minimization algorithm, step e) of the method being carried out by an iterative method according to the following steps:
    e'1) from the value of the reflection or transmission coefficient, determine the variation in impedance of the second assembly over the range of frequencies,
    e'2) provide an initial theoretical input value for the conductivity of the target in the model,
    e'3) using the model, evaluate the theoretical variation in impedance of the second assembly for the range of frequencies,
    e'4) evaluate the difference between the theoretical variation in impedance of the second assembly and the measured variation in impedance of the second assembly;
    e'5) minimize said difference;
  the method is adapted to determine simultaneously a plurality of conductivities of a multi-layer semiconducting target or to measure a plurality of semiconducting targets;
  the method is adapted to determine the thickness of each layer of the multi-layer semiconducting target;

the first assembly comprises at least one digital-to-analog converter, said converter being adapted to emit a multifrequency signal, the first assembly further comprising an analog-to-digital converter acquisition system, said acquisition system being adapted to receive a reflected or transmitted multifrequency signal;

the first assembly comprises at least one coupling system, said coupling system being adapted to couple the signal emitted by the digital-to-analog converter in the transmission line, and to couple the reflected or transmitted signal to the analog-to-digital converter acquisition system;

the first assembly comprises at least two coupling systems, a first coupling system being adapted to couple the signal emitted by the digital-to-analog converter in a first transmission line, and a second coupling system being adapted to couple the reflected or transmitted signal in a second transmission line to the analog-to-digital converter acquisition system;

the range of frequencies of the emitted signal is between 100 kHz and 300 MHz;

the range of frequencies is chosen such that the variations in the reflection or transmission coefficient are maximized for a given variation in conductivity around a particular measurement frequency; and the method uses a high range of frequencies to measure low conductivities.

The invention also relates to a device for contactless measurement of the conductivity of semiconductors, characterized in that it comprises:

a first assembly, said first assembly being a signal emission/reception system capable of emitting/receiving a multifrequency signal over a range of frequencies, a second assembly, said second assembly comprising at least one semiconducting target and an inductor element, the semiconducting target being positioned close to the inductor element, at least one transmission line, said transmission line being adapted to transmit the signal between the first assembly and the second assembly, a third assembly, said third assembly being intended to be connected to the first assembly, the third assembly comprising an analysis system, the third assembly being adapted to analyze an emitted signal and a reflected or transmitted signal received by the first assembly, and the third assembly being adapted to derive therefrom a reflection or transmission coefficient of the emitted signal.

In various embodiments of the device according to the invention, use may possibly be made of one or more of the following:

the inductor element is printed on a circuit board, said circuit board being positioned near the semiconducting target; and the inductor element is a coil having an inner radius and an outer radius, and the target extends along two dimensions in a plane perpendicular to a main direction of the inductor element, the inner and outer radii of the inductor element being smaller than the dimensions of the target, possibly about half the dimensions of the target.

BRIEF DESCRIPTION OF THE DRAWINGS

Other features and advantages of the invention will be apparent from the following description of one of its embodiments, given by way of non-limiting example, with reference to the accompanying drawings.

In the various figures, the same references designate identical or similar elements.

DETAILED DESCRIPTION OF THE DISCLOSURE

Figure 1:
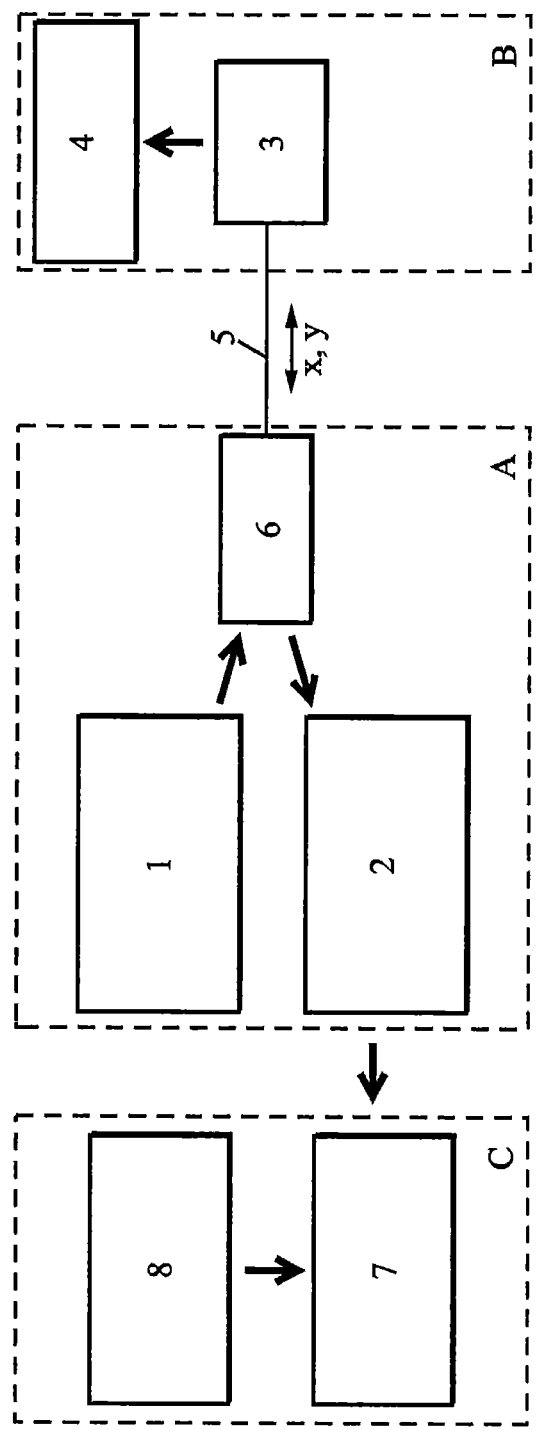
FIG. 1 schematically represents a first embodiment of a device for measuring conductivity according to the invention, comprising a first assembly, a second assembly, and a third assembly connected to the first assembly.

The conductivity of a target of semiconductor material 4 (hereinafter called a "target") is measured by transmitting a multifrequency signal in an inductor element 3 of variable size and shape, for example a coil 3, placed close to the target 4. The coil 3 is for example implemented on a printed circuit board inserted into an electronic circuit. The inductor element 3 has a height h3 and extends between a front end 3a and a back end 3b. Front and back are used herein to designate respectively the end of the inductor element 3 nearest to the target 4 and the end furthest from the target 4. Alternatively, a plurality of inductor elements 3 may be used, in particular coils 3, each inductor element 3 being adapted for a range of frequencies Δf.

As illustrated in FIG. 1, the device for measuring conductivity comprises a first assembly A for emitting-receiving a multifrequency signal. The device for measuring conductivity also comprises a second assembly B comprising the target 4 and an inductor element 3 placed close to the target 4. The first assembly A and second assembly B are interconnected by a transmission line 5.

The first assembly A emits a multifrequency signal X towards the second assembly B along the transmission line 5, and measures the signal Y reflected or transmitted by the second assembly B towards the first assembly A along the transmission line 5. In the following, we will also designate the reflected or transmitted signal Y as the signal Y received by the first assembly A.

A third assembly C is connected to the first assembly A. The signals emitted X and received Y are analyzed by the third assembly C. The third assembly C determines the reflection p or transmission R coefficient (hereinafter called "Y/X ratio") of the signal Y reflected or transmitted relative to the signal X emitted by the second assembly B. The conductivity of the target 4 is thus deduced.

More particularly, as shown in FIG. 1, the first assembly A comprises a signal generation system 1, in particular based on a digital-to-analog converter (hereinafter referred to as "DAC"). The first assembly A also comprises an acquisition system 2, in particular based on an analog-to-digital converter (hereinafter referred to as "ADC"). The first assembly A also comprises a coupling system 6 adapted to couple the signal X emitted by the DAC 1 in the transmission line 5 and to couple the received signal Y to the ADC 2.

Figure 2:
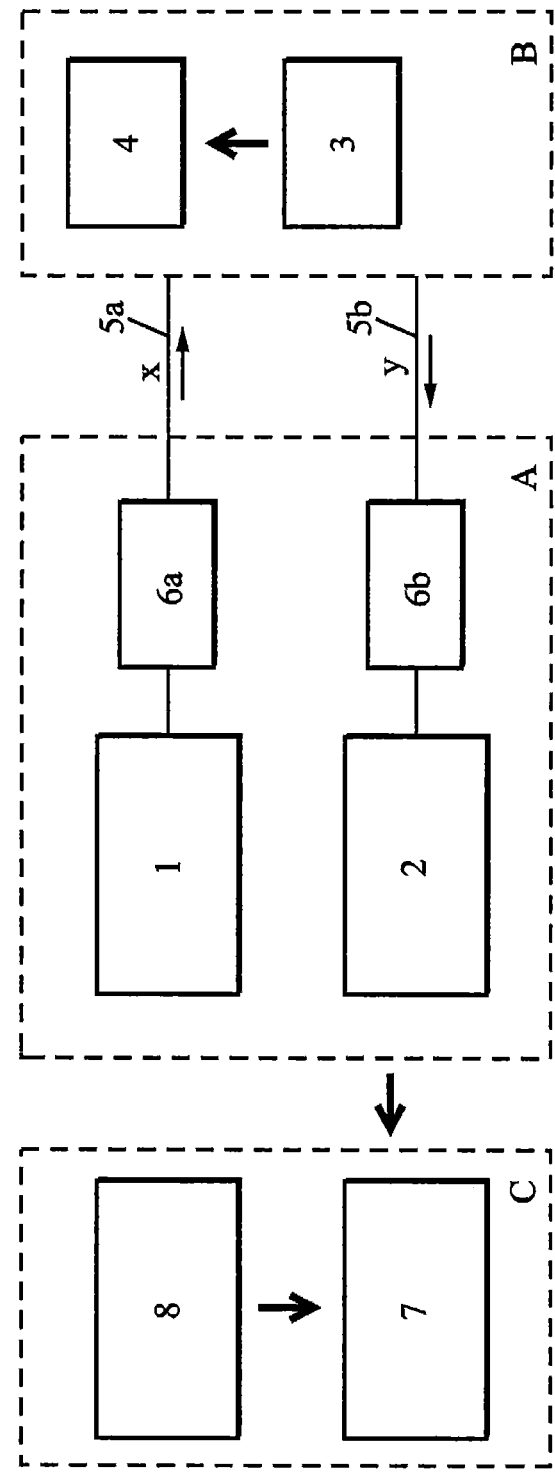
FIG. 2 schematically represents another embodiment of the device for measuring conductivity according to the invention, comprising a first assembly, a second assembly, and a third assembly connected to the first assembly.

Alternatively, as illustrated in FIG. 2, the first assembly A may comprise a first coupling system 6a and a second coupling system 6b. The first coupling system 6a is adapted to couple the signal X emitted by the DAC 1 to the transmission line 5. The second coupling system 6b is adapted to couple the transmitted signal Y from the transmission line to the ADC 2. In this embodiment, a first transmission line 5a transmits the emitted signal X from the first assembly A to the inductor element 3 while a second transmission line 5b transmits the received signal Y from the second assembly B, in particular from the inductor element 3, to the first assembly A.

Figure 3:
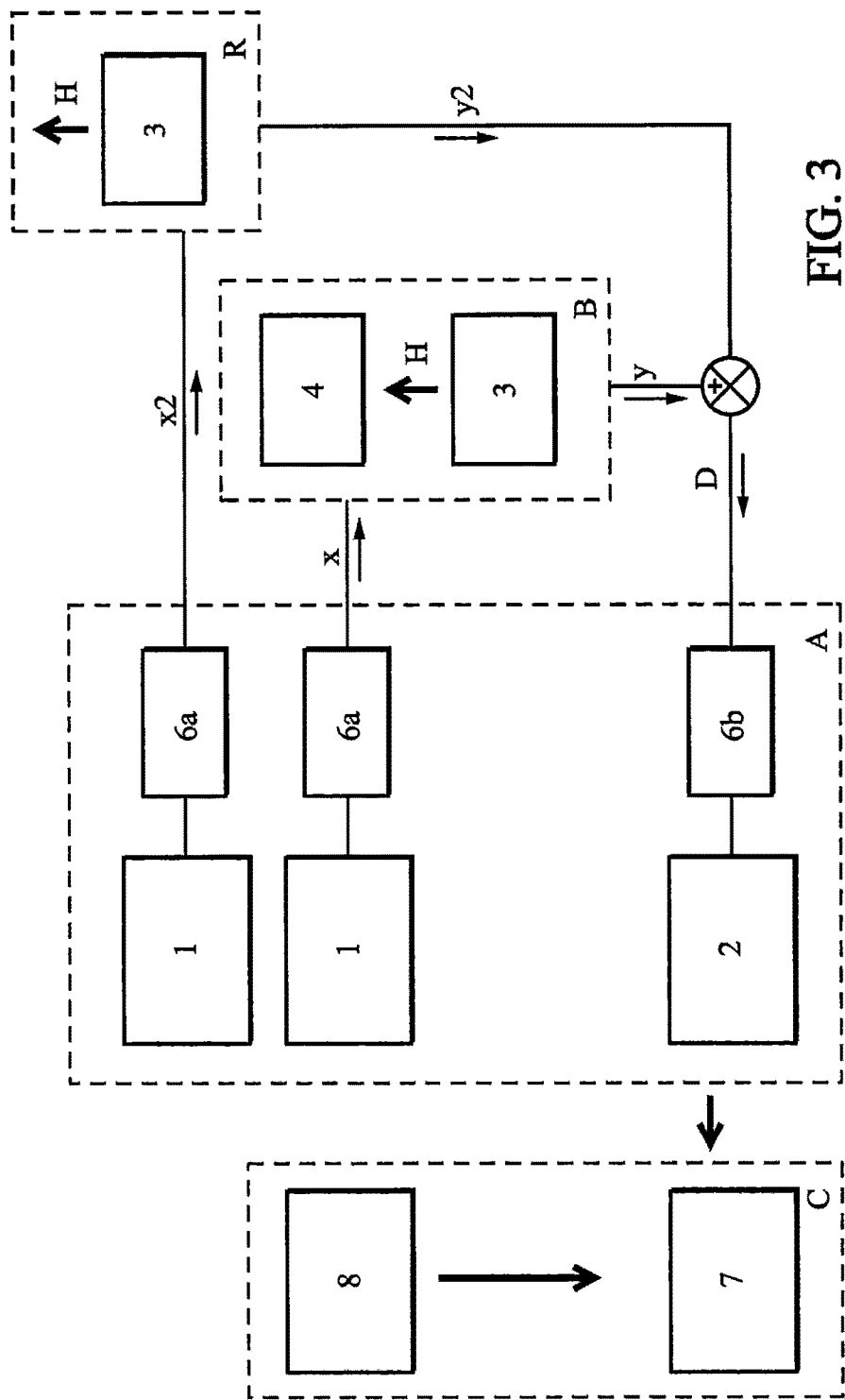
FIG. 3 schematically represents another embodiment of the device for measuring conductivity according to the invention, further comprising a reference assembly connected to the first assembly.

According to another variant, as illustrated in FIG. 3, the first assembly may also be connected to a reference assembly R. More specifically, the first assembly A also comprises an additional DAC 1a and an additional first coupling system 6a. Thus, the first assembly A is also adapted to emit a signal X2 towards the reference assembly R. In another embodiment, a single DAC 1 can be used for emitting signals X and X2. Signal X2 corresponds to the signal X emitted towards the second assembly B, but out of phase by phase P.

The reference assembly R comprises an inductor element 3 identical to that of the second assembly B, in particular as will be described below. However, unlike the second assembly B, the reference assembly R does not comprise a target 4. The reference assembly R thus allows measuring the signal transmitted or reflected Y2 by the inductor element 3 when this inductor element 3 is not in the presence of the target 4, in other words when the inductor element 3 is surrounded only by air. Alternatively, the inductor element 3 of the reference assembly R may be surrounded by a reference material or may be close to a reference target.

A block then allows adding, and in particular amplifying, the signal Y emitted or reflected by the second assembly B with the signal Y2 emitted or reflected by the reference assembly R. We thus obtain a final signal D such that:

$$D=A*(Y+Y2)$$

where A is an amplification constant. In particular, P is preferably equal to n in order to obtain a differential amplification between signals Y and Y2. The final signal D is then transmitted to the first assembly A, and in particular to the ADC 2.

Figure 4:
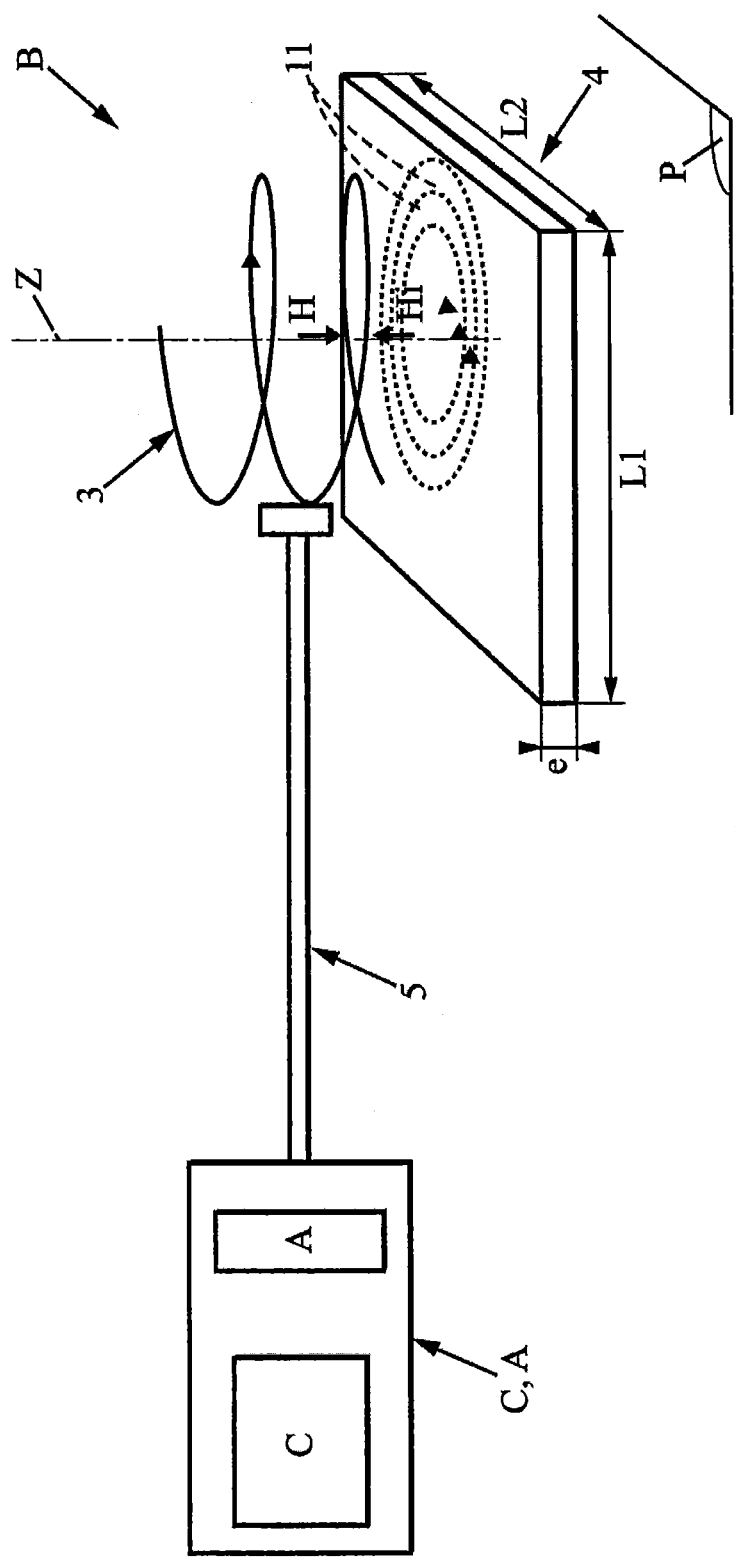
FIG. 4 shows a schematic perspective view of the second assembly of FIGS. 1 and 2.

In the second assembly B, the semiconducting target 4 is located close to the inductor element 3. In particular, the target 4 extends in a plane P perpendicular to a main direction Z of the inductor element 3, as shown in FIG. 4.

Figure 4A:
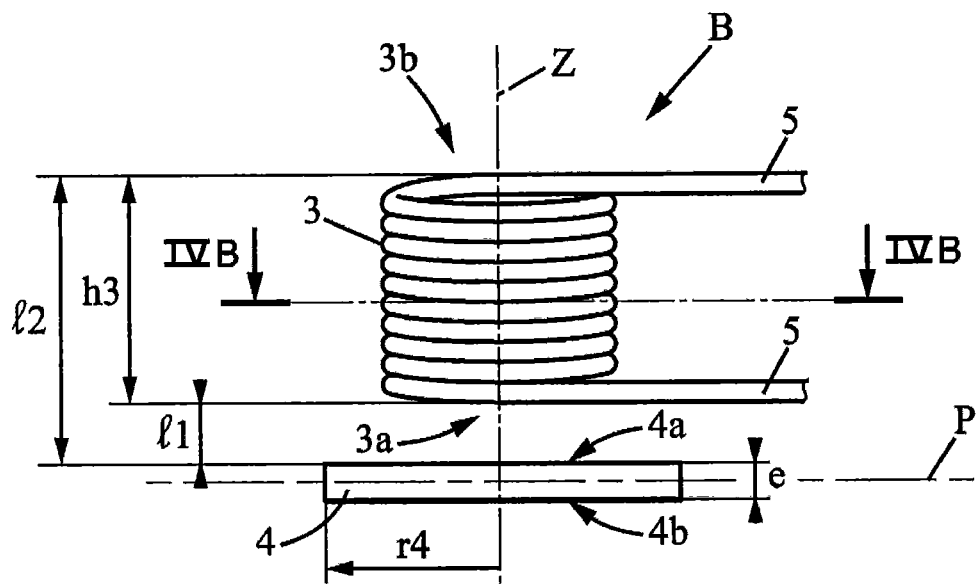
FIG. 4A shows a schematic side view of the second assembly of FIG. 4.
Figure 4B:
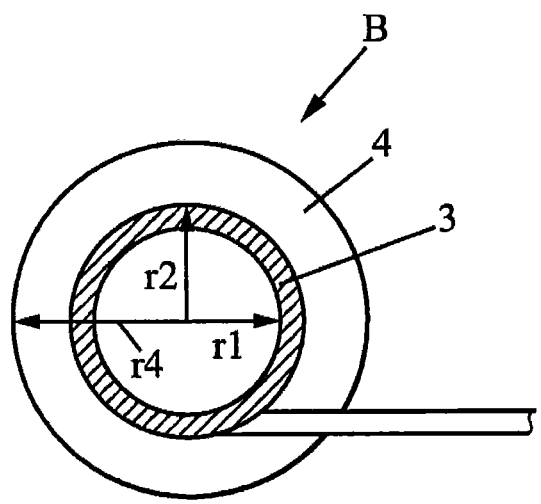
FIG. 4B shows a schematic cross-section view along plane IVB-IVB of FIG. 4A.

As represented in greater detail in FIGS. 4A and 4B, the target 4 may be circular. In this embodiment, the target 4 has a radius r4. The target 4 thus comprises a thickness e in the main direction Z between a first face 4a and a second face 4b. The first face 4a is in particular at a distance $\ell 1$ from the front end 3a of the inductor element 3 along the main direction Z. The first face 4a is also at a distance $\ell 2$ from the back end 3b of the inductor element 3 along the main direction Z. In other words, the distances $\ell 1$, $\ell 2$ and the height h3 of the inductor element 3 are related as follows:

$$h3 = \ell 2 - \ell 1.$$

As shown in greater detail in FIG. 4B, the inductor element 3 may be a coil and comprises an inner radius r1 and an outer radius r2. The inner and outer radii r1, r2 are for example respectively equal to the radius r4 of the target 4. Alternatively, the inner and outer radii r1, r2 are respectively less than the radius r4 of the target 4. Preferably, the distances $\ell 1$, $\ell 2$ between the faces 4a, 4b of the target 4 and the coil 3 are small compared to the inner and outer radii r1, r2 of the coil 3.

For example, for a range of frequencies Δf between 1 MHz and 50 MHz, a coil 3 having an outer radius r2 of 3 cm with 5 turns can be used to measure the conductivity of a target 4 having a radius r4 in plane P equal to about 3 cm. The number of turns of the coil 3 can be reduced when using higher frequencies.

According to another embodiment represented in FIG. 4, the target 4 may be square or rectangular and extends in plane P along two dimensions L1, L2. The dimensions L1, L2 of the target 4 are preferably respectively equal to about 10 cm in plane P. In another example, the dimensions L1, L2 are preferably equal to about four times the outer radius r2 of the coil 3.

In this manner, the target 4, and in particular the induced magnetic field Hi (as explained below), interacts with the inductor element 3. The distance $\ell 1$ between the target 4 and the inductor element 3 is then for example about 1 mm.

The transmission line 5 connects the first assembly A to the second assembly B. The transmission line 5 has a characteristic impedance $Z_{line}$ adapted to the output impedance of the assembly A. The transmission line 5 is for example a track on a printed circuit board or a coaxial cable or a wire or a two-wire line.

The third assembly C comprises a data analysis system 7, the third assembly C being able to analyze the data of the emitted signal X and of the signal Y reflected or transmitted by the second assembly B. The third assembly C thus allows deducing the ratio Y/X of the signal Y received by the second assembly B in relation to the emitted signal X, then the conductivity of the target 4.

The operation of the device will now be described in more detail.

A multifrequency signal X is emitted over a range of frequencies Δf by the DAC 1 of the first assembly A. The signal is for example of the form:

$$x(t) = \sum_{i=1}^{n} A_i \cos(\omega_i t + \varphi_i)$$

which is the sum of signals of N different frequencies $w_i$, where $A_i$ is the amplitude of these N signals, and $\varphi_i$ is the phase of each of the signals. For each frequency $w_i$, the amplitude A may in particular be greater than or equal to zero.

More specifically, the emitted signal X may be of the form:

$$x(t) = \sum_{i=1}^{N/2} a_i \cos\left(\frac{2\pi i}{NT_e} t + \varphi_i\right)$$

where i represents the index of the ith frequency, $T_e$ the sample emission period, $a_i$ the amplitude of N/2 frequencies, and $\varphi_i$ their respective phases. More specifically, the N/2 frequencies are selected from a range of frequencies Δf relevant for characterization of the target 4. The amplitudes $a_i$ may be greater than or equal to zero and may be different, in order to weight the emitted signal X according to the wishes of the user, in particular by attenuating or canceling certain frequencies. The phases $\varphi_i$ may be chosen arbitrarily but ideally so as to minimize the crest factor c:

$$c = \frac{|x|_{peak}}{x_{RMS}}$$

Such a transmitted signal X simultaneously contains all frequencies useful to characterization of the second assembly B. In particular, the minimum duration of the emitted signal X is determined by its fundamental frequency $f_1$, more precisely determined by $$f_1 = \frac{1}{NT_e}.$$

For example, if $f_1$=1 MHz, the period $T_e$ of the emitted signal X is 1 μs.

It is then possible to obtain a measurement of the conductivity of the target 4 within a very short time, and to observe very rapid variations in conductivity.

Periods of the emitted signal X may be generated continuously or in bursts. The periods of the corresponding received signal Y can thus possibly be averaged. This also allows characterizing the evolution of the target 4 over time, for example by frequency analysis using Fast Fourier Transform (FFT) with sliding window.

Alternatively, the emitted signal X may be a signal whose frequency varies sequentially, for example with a period of time at a first frequency $f_{T1}$, then a period of time at a second frequency $f_{T2}$, or with a fixed frequency over time.

The measurement device thus enables measuring the conductivity of the target 4 in different modes: continuous mode or time-dependent mode.

The emitted signal X is coupled via the coupling system 6, in particular the first coupling system 6a, to the transmission line 5 in order to be transmitted to the transmission line 5, in particular to the first transmission line 5a. The emitted signal X is thus received by the second assembly B. More specifically, the inductor element 3 of the second assembly B is supplied the emitted signal X.

As illustrated in FIG. 4, the inductor element 3, in particular the coil 3, then generates an alternating magnetic field H. The target 4 is therefore in a magnetic field H that varies over time. Eddy currents 11, schematically represented in FIG. 4, are then induced in the target 4, which behaves as a closed electric circuit.

The target 4 is traversed by the eddy currents 11, which causes an induced magnetic field $H_i$ and a variation in impedance δZ of the second assembly B. The variation in impedance δZ consists of the difference between the impedance $Z_{target}$ of the inductor element 3 in the presence of the target 4, and in particular in the presence of the induced magnetic field $H_i$, and the impedance $Z_{air}$ of the inductor element 3 in the absence of the target 4, meaning when the inductor element 3 is surrounded only by air. $Z_{air}$ can for example be directly measured using the signals X2, Y2 of the reference assembly R of FIG. 3. Thus, the variation in impedance δZ of a coil 3 as described above is more particularly given by the following relation:

$$\delta Z = Z_{cible} - Z_{air} = -i\omega\mu 0 \int_0^\infty \left[\frac{\chi(\alpha r1 - \alpha r2)}{\alpha^3}\right]^2 [e^{-\alpha l1} - e^{-\alpha l2}] A0(\alpha) d\alpha$$

where r1 and r2 are respectively the inner and outer radii of the coil 3. $\ell 1$, $\ell 2$ correspond to the respective distances between the front end 3a and back end 3b of the coil 3 with respect to the target 4 along the main direction Z, as described above. A0 expresses the dependence of the magnetic field on the properties of the target 4 in the domain containing the inductor element 3. In particular, A0 varies according to the thickness e and conductivity of the target 4. μ0 is the magnetic permeability of a vacuum and ω at a given frequency. ω corresponds to a Bessel's integral.

Figure 5:
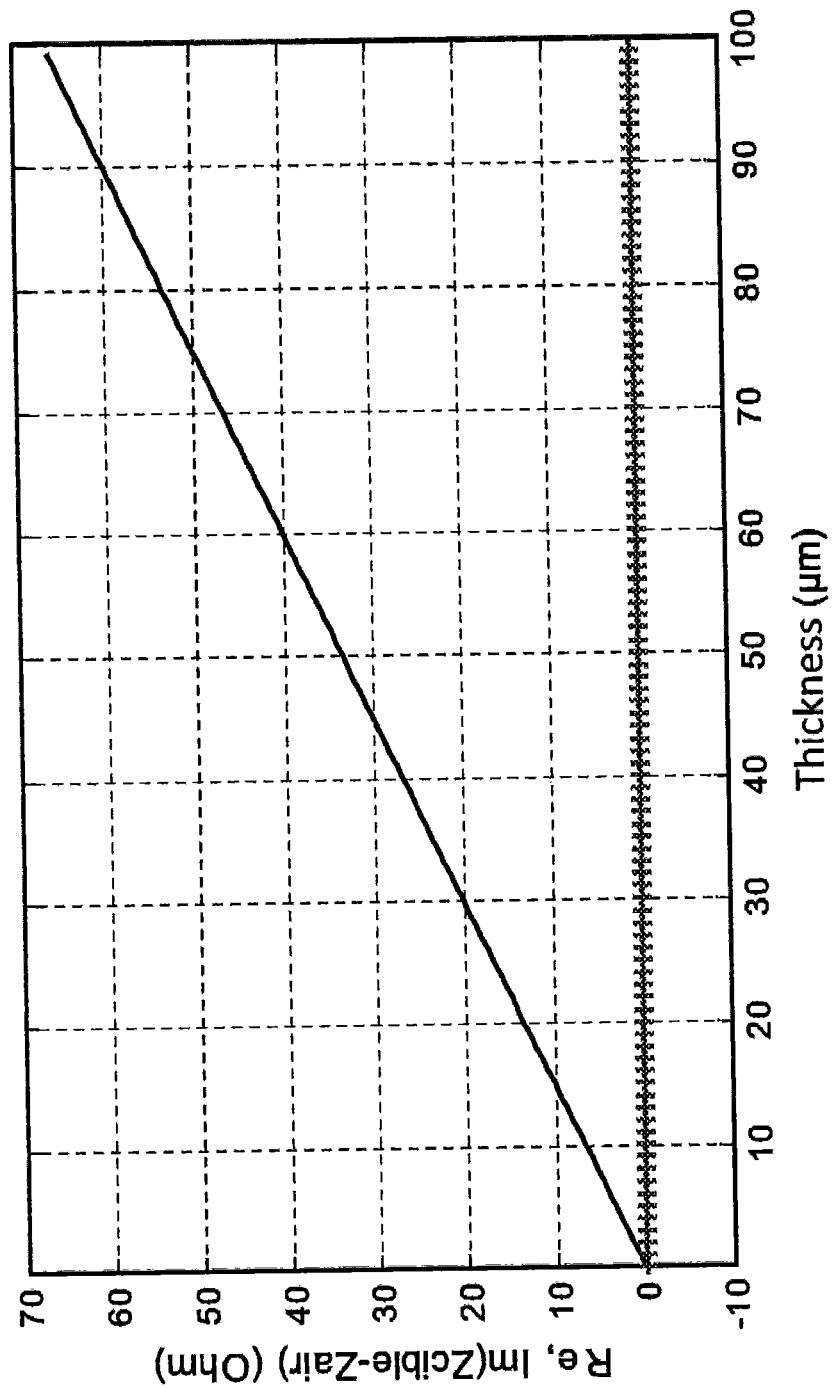
FIG. 5 shows the real part and the imaginary part of the variation in impedance of the inductor element as a function of the target thickness.
Figure 6:
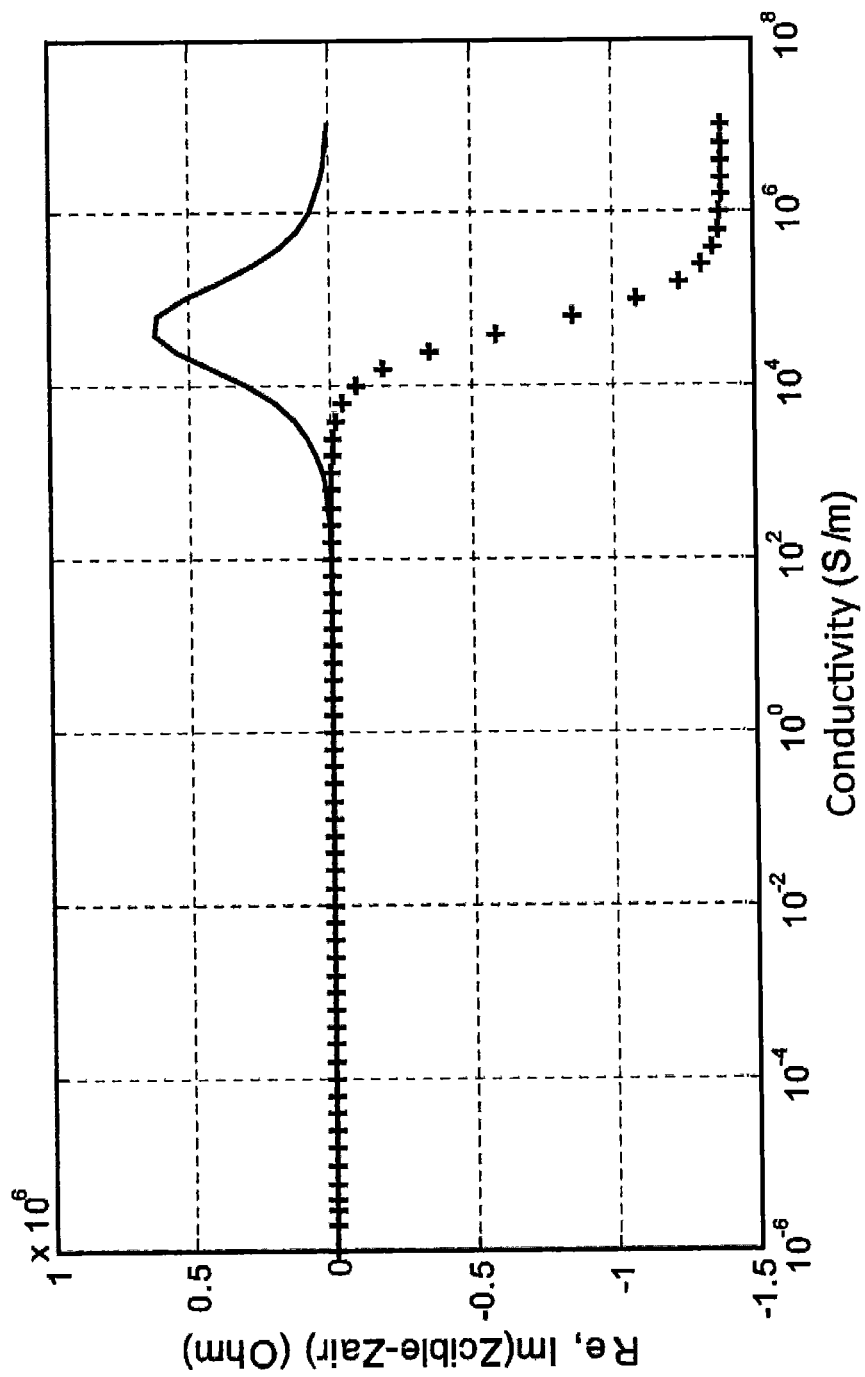
FIG. 6 shows the real part and the imaginary part of the variation in impedance of the inductor element as a function of the target conductivity.

At a frequency and a distance $\ell 1$ between the inductor element 3 and the given target 4, the variation in impedance δZ of the coil 3 is therefore dependent on the conductivity and the thickness e of the target 4 by means of the amplitude A0. An example of the relationship between the variation in impedance δZ and the thickness e of the target 4 is more specifically illustrated in FIG. 5. An example of the relationship between the variation in impedance δZ and the conductivity of the target 4 is more specifically illustrated in FIG. 6. In these FIGS. 5 and 6, the solid curve and the curve of crosses respectively correspond to the values of the real part and of the imaginary part of the variation in impedance δZ. These examples in FIGS. 5 and 6 are purely illustrative and are not limiting.

Because of this variation in impedance δZ, the second assembly B comprising the inductor element 3 and the target 4 thus reflects or transmits part of the signal to the ADC 2 of the first assembly A via the transmission line 5.

The ADC 2 can thus measure the signal Y reflected or transmitted by the second assembly B. In particular, the reflected or transmitted signal Y is coupled by means of the coupling system 6, in particular the second coupling system 6b, to the ADC 2.

The ADC 2 then transmits the received signal Y to the third assembly C. The third assembly C analyzes the signals emitted X and received Y that are transmitted by the first assembly A, and determines the ratio Y/X of the second assembly B over the range of frequencies iΔ. In particular, the Fourier transform of the received signal Y relative to the emitted signal X provides a measurement of this ratio Y/X which corresponds either to a reflection coefficient ρ, or to a frequency transmission coefficient R:

ρ,R=Y/X

The impedance $Z_{target}$ of the second assembly B, in particular of the inductor element 3, is related to the ratio Y/X, expressed in the plane of a section of the transmission line 5, by the equation:

ρ=$(Z_{target}+Z_{line})/(Z_{target}+Z_{line})$ in reflection

R=$2Z_{target}(Z_{target}+Z_{line})$ in transmission where $Z_{line}$ designates the impedance of the transmission line 5 and $Z_{target}$ the impedance of the inductor element 3. It is thus possible to determine the variation in impedance δZ of the second assembly B from the ratio Y/X, and vice versa.

We will now describe the third assembly C in more detail.

According to a first embodiment of the invention, the third assembly C comprises an analysis system 7. The analysis system 7 uses a model 8 relating the variation in impedance δZ of the second assembly B to the conductivity of the target 4. The model 8 may in particular be approximated by benchmarking with a set of targets 4 of known conductivity, made of different reference materials.

The analysis system 7 determines the ratio Y/X from on the emitted signal X and the received signal Y, and then determines the variation in impedance δZ of the second assembly B. Based on this variation in impedance δZ, the model 8 then allows deducing the conductivity of the target 4 over the range of frequencies Δf.

In a second embodiment, the analysis system 7 of the third assembly C uses a model of the electromagnetic interaction between the inductor element 3 and the target 4. The analysis system 7 then also comprises a minimization algorithm.

Thus, a theoretical initial input value for the conductivity of the target 4 is transmitted in the model 8, so that a theoretical variation in impedance is deduced at different frequencies within the range of frequencies Δf. These theoretical values of the variation in impedance are compared to the measured experimental values of the variation in impedance δZ determined by the analysis system 7 over the same range of frequencies Δf. The difference is calculated and the conductivity input value of the model 8 is gradually adjusted by iteration to minimize this difference. The conductivity of the semiconducting target 4 is thus determined. This iterative adjustment may also be performed by comparing values of experimental Y/X ratios with values of theoretical Y/X ratios.

Alternatively in this second embodiment, both the conductivity and the thickness e of a semiconducting target can be estimated by the iterative method.

As another alternative, one can estimate a plurality of parameters of the target 4 by using the iterative method. For example, it is possible to measure the conductivity or conductivities and/or the thickness or thicknesses of a target 4 comprising multi-layer and/or inhomogeneous material. Indeed, by changing the frequency of the signal X emitted towards the second assembly B, it is possible to change the depth of penetration of the magnetic field H in the target 4. Thus, the received signal Y is necessarily dependent on the first layer the target 4, but may not be dependent on all layers of the target 4. By varying the frequency of the emitted signal X and therefore the depth of penetration of the magnetic field H, it is possible to reconstruct a conductivity profile of the target 4 for different layers of a multi-layer material or for different areas of an inhomogeneous material.

Still according to this second embodiment, in the case for example of a single-layer target 4 for which the thickness e and conductivity are to be determined, these two parameters are initially estimated or randomly selected, then transmitted as initial input values in the model 8 of the third assembly C. The measurements of the Y/X ratio for these two parameters for M different frequencies are then compared to the result of the experimental measurement for these M frequencies.

The input values of the model 8, in particular the thickness e and the conductivity, are then modified iteratively via the minimization algorithm until a termination criterion is reached, for example until the gap between the output values of the model 8 and the result of the experimental measurements is less than a predetermined tolerance.

The initial input values of the model 8 may be chosen arbitrarily, in particular randomly. In particular, the model 8 is adapted to converge toward final output values. The final output values of the model 8 then provide an estimate of the thickness e and conductivity parameters of the target 4. In particular, in the case where the target 4 is single-layer and of known thickness e, the situation is identical, with only one parameter (conductivity) to be determined.

In general, this measurement method can be generalized to N parameters to be determined and M measurement frequencies, with the number of measurement frequencies M greater than or equal to the number N of parameters to be determined. Moreover, since each measurement frequency M allows clearly determining the real part and the imaginary part of a signal, it may also be possible to determine N parameters if the number of measurement frequencies M is greater than or equal to N/2 parameters to be determined.

The boundary conditions in the model 8 are adapted to the target 4. The complete geometry of the target 4 is in particular taken into account as values in the model 8. The minimum thickness e of the target 4 that can be taken into account in the model 8 is for example less than 1 μm, even about 10 nm. The distance $\ell 1$ is also taken into account and compensated for in the model 8 in order to take into account field losses.

In this second embodiment, it is also possible to measure a plurality of targets 4 at a time. Alternatively, a target 4 may be tested multiple times, by area.

Figure 7:
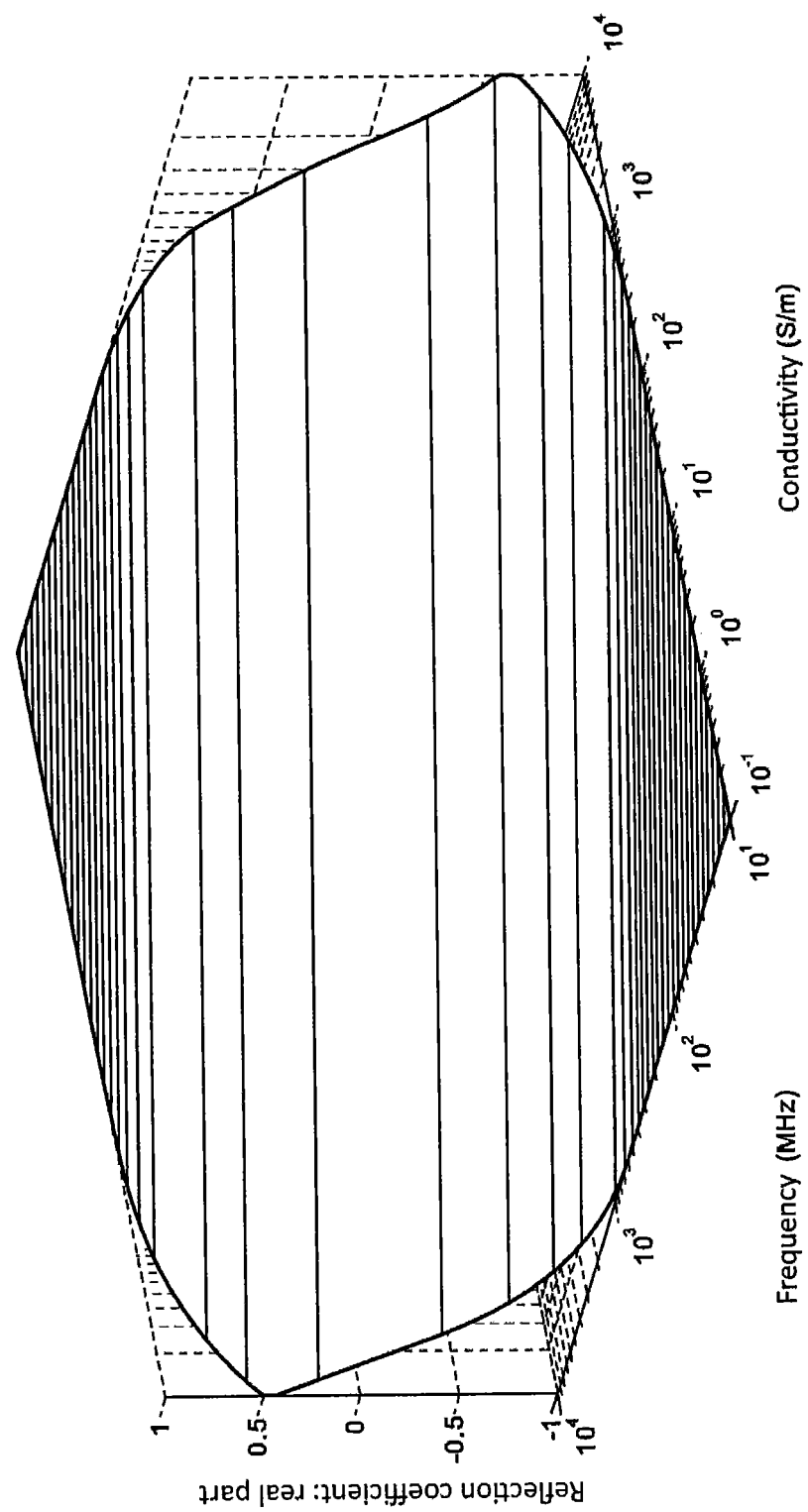
FIG. 7 shows the real part of the reflection coefficient as a function of the emitted signal frequency and the target conductivity.
Figure 8:
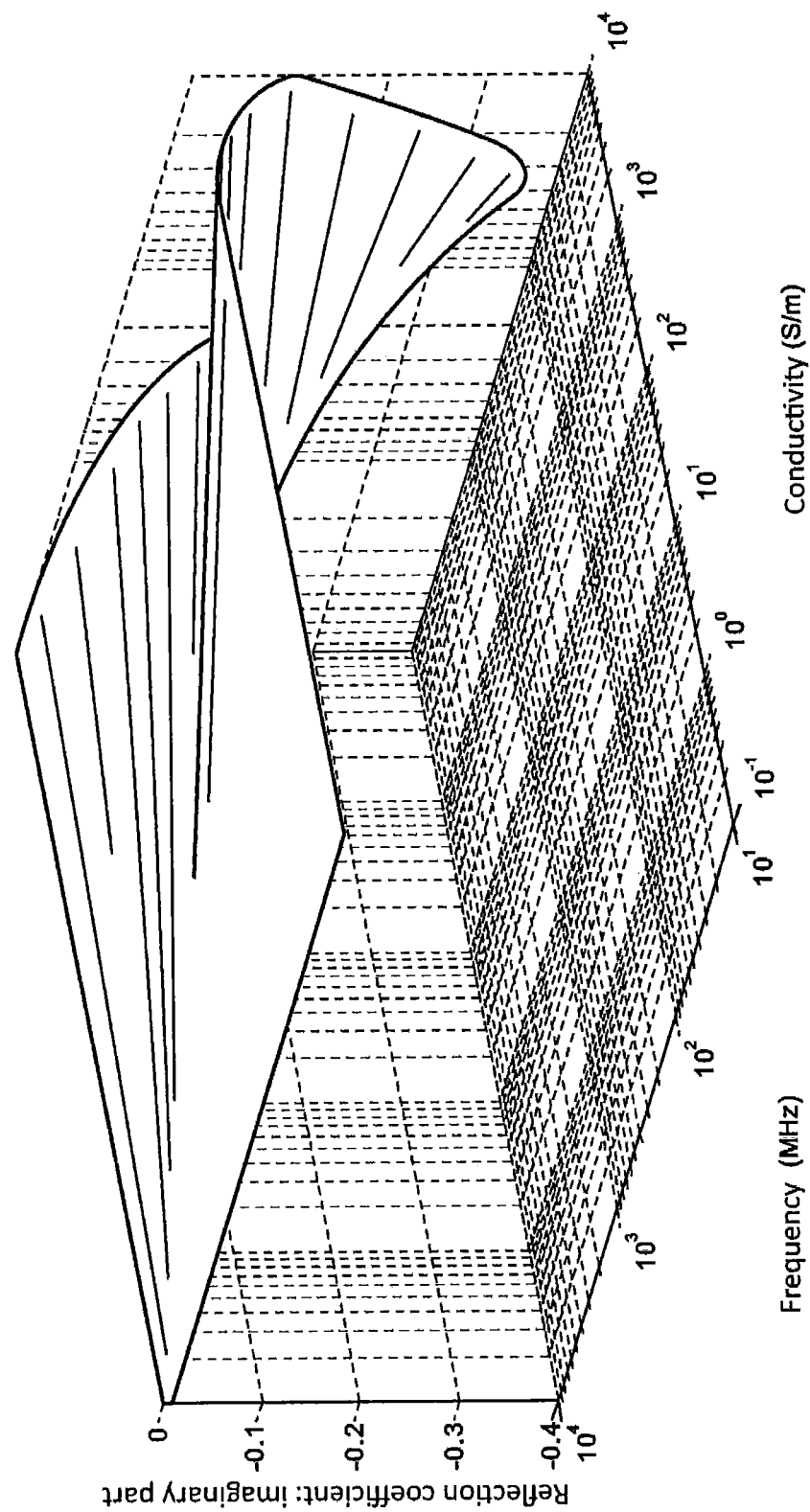
FIG. 8 represents the imaginary part of the reflection coefficient as a function of the emitted signal frequency and the target conductivity.

As illustrated in FIGS. 7 and 8, for a given conductivity and thickness e of a target 4, there is a range of frequencies Δf providing optimal measurement sensitivity. In particular, "optimal measurement sensitivity" is understood to mean that the Y/X ratio has a real part and/or an imaginary part respectively varying maximally around a particular measurement frequency.

There is thus a range of frequencies Δf for each conductivity of the layers of the target 4 to be measured, especially around the particular measurement frequency, in which the measurement sensitivity is maximized.

The lower the conductivity of the target 4, the more it is necessary to use an emitted signal X having high frequencies in order to achieve optimal measurement sensitivity. Thus, characterization of a target 4 having one or more layers of low conductivity and low thickness is advantageously improved by the use of an emitted signal X having high frequencies. In addition, high conductivity of the target 4 results in little variation in the Y/X ratio for high frequencies.

The range of frequencies Δf may be between 100 kHz to 2 GHz, or even between 100 kHz to 300 MHz. A field-programmable gate array (FPGA) or a fast processor coupled with fast digital-to-analog and analog-to-digital converters can be used to quickly sweep a wide range of frequencies Δf.

The conductivity of a large number of materials can be estimated by this method, such as silicon, as well as compounds such as CIGS, CdTe, organic materials, new organic materials such as perovskites, layers such as those based on III-V materials used in p-n multi-junctions. Alternatively, the method is used to optimize surface treatments for multi-layers/multi-junctions.

The thickness or thicknesses of the semiconductor materials of the target 4 may be suitable for applications in electronics, particularly in the field of photovoltaics. These thicknesses usually range from about 50 nm to a few micrometers for thin film materials, and a few tens of micrometers to several hundred micrometers for bulkier materials such as crystalline silicon for example. Their conductivities can vary from $10^{-3}$ S·m$^{-1}$ to $10^4$ S·m$^{-1}$. These conductivity values cover the typical range of conductivities of different types of semiconductor materials, particularly those used in photovoltaics, depending on whether they are in the form of thin films or in the form of self-supporting plates.

The device is used for example for non-destructive material testing of the target 4.

Alternatively, the second assembly B, and in particular the target 4, may be used in solution or embedded in ceramic for use in environments subjected to high thermal or chemical stresses, since a semiconductor is sensitive to environmental conditions.

Alternatively, the target 4 may be used in a chemical bath.

The measurement device enables measuring the conductivity of the target 4 in darkness. A reference measurement in darkness may in particular be used to allow more sensitive measurement of the conductivity and/or thickness e of targets 4 comprising one or more materials having little photoconductivity.

The measurement device also enables measuring the conductivity when the target 4, and in particular its first face 4a and/or its second face 4b, is subjected to illumination. In the case where the target 4 is used under illumination, the measurement device can thus be capable of measuring conductivity values in a time-dependent mode. In this time-dependent mode, the values of the conductivity applied to the target 4 may be linked to the lifespan of the charge carriers of the target 4.

It is then necessary that the method and the measurement device be sufficiently fast to detect the lifespan of the charge carriers in time-dependent mode. In this embodiment, the measurement method may thus comprise an FPGA card or a fast processor coupled to fast digital-to-analog and analog-to-digital converters, as described above. An FPGA card allows providing a very fast measurement method which enables measuring the short lifetimes of charge carriers of the target 4 or integration into a measurement system.

It is thus possible in the measurement method to combine the emitting of a signal X as described above with an illumination of the target 4. Such a combination allows increasing the sensitivity of the conductivity measurement for the target 4, in particular for a multi-layer target 4.

Furthermore, a target surface 4, in particular the first surface 4a, can be treated in order to modify the lifetime of the charge carriers of the target 4.

Of course, the invention is not limited to the embodiments described above and provided only as examples. It includes various modifications, alternative forms, and other variants conceivable to a person skilled in the art within the context of the present invention, and in particular all combinations of the various modes of operation of the device and/or method described above, which may be applied separately or in association.

The invention claimed is:

1. A method of contactless measurement of the conductivity of semiconductors, said method being implemented by:

a first assembly comprising a signal emission/reception system capable of emitting/receiving a multifrequency signal over a range of frequencies, a second assembly comprising one semiconducting target and an inductor element, the semiconducting target being positioned close to the inductor element, a transmission line, said transmission line being adapted to transmit the signal between the first assembly and the second assembly, and a third assembly, said third assembly being intended to be connected to the first assembly, the third assembly comprising an analysis system, the third assembly being adapted to analyze a signal emitted by the first assembly and a reflected or transmitted signal received by the first assembly, and the third assembly being adapted to derive therefrom a reflection or transmission coefficient of the emitted signal, said method comprising the following steps:

a) the first assembly emits a multifrequency signal, b) the second assembly reflects or transmits part of the multifrequency signal emitted by the first assembly, c) the first assembly receives the multifrequency signal reflected or transmitted by the second assembly, d) the third assembly calculates the reflection or transmission coefficient of the emitted signal for the range of frequencies, e) the third assembly determines the conductivity of the semiconducting target;

and wherein the emitted multifrequency signal is of the form:

$$x(t) = \sum_{i=1}^{N/2} a_i \cos\left(\frac{2\pi i}{NT_e} t + \varphi_i\right)$$

where $T_e$ is the period of each sample of the emitted multicarrier signal, $a_i$ the amplitude of each frequency composing the multicarrier signal, and $\varphi_i$ its respective phase.

2. The method of contactless measurement according to claim 1, wherein the analysis system of the third assembly uses a model relating variation in impedance of the second assembly to the conductivity of the target, step e) of the method comprising the following steps carried out beforehand by the third assembly:

e1) from the value of the reflection or transmission coefficient, determine the variation in impedance of the second assembly over the range of frequencies, e2) with the model, deduce the conductivity of the target from the variation in impedance of the second assembly.

3. The method of contactless measurement according to claim 1, wherein the analysis system of the third assembly uses a model of the electromagnetic interaction between the inductor element and the semiconducting target and a minimization algorithm, step e) of the method being carried out by an iterative method according to the following steps:

from the value of the reflection or transmission coefficient, determine the, variation in impedance of the second assembly over the range of frequencies, provide an initial theoretical input value for the conductivity of the target in the model, using the model, evaluate the theoretical variation in impedance of the second assembly for the range of frequencies, evaluate the difference between the theoretical variation in impedance of the second assembly and the measured variation in impedance of the second assembly, minimize said difference.

4. The method of contactless measurement according to claim 3, wherein, using several penetration depths associated to different frequencies of the multifrequency signal a plurality of conductivities of a mid-layer semiconducting target is simultaneously determined or to a plurality of semiconducting targets is measured.

5. The method of contactless measurement according to claim 4, wherein thickness of each layer of the multi-layer semiconducting target is determined, using upon several penetration depths associated to different frequencies of the multifrequency signal.

6. The method of contactless measurement according to claim 1, wherein the first assembly comprises one digital-to-analog converter, said converter being adapted to emit the multifrequency signal, the first assembly further comprising an analog-to-digital converter acquisition system, said acquisition system being adapted to receive the reflected or transmitted multifrequency signal.

7. The method of contactless measurement according to claim 6, wherein the first assembly comprises one coupling system, said coupling system being adapted to couple the signal emitted by the digital-to-analog converter in the transmission line, and to couple the reflected or transmitted signal to the analog-to-digital converter acquisition system.

8. The method of contactless measurement according to claim 6, wherein the first assembly comprises two coupling systems, a first coupling system being adapted to couple the signal emitted by the digital-to-analog converter in a first transmission line, and a second coupling system being adapted to couple the reflected or transmitted signal in a second transmission line to the analog-to-digital converter acquisition system.

9. The method of contactless measurement according to claims 1, wherein the range of frequencies of the emitted signal is between 100kHz and 300MHz.

10. The method of contactless measurement according to claim 1, wherein the range of frequencies is chosen such that the variations in the reflection or transmission coefficient are maximized for a given variation in conductivity around a particular measurement frequency.

11. A device for contactless measurement of the conductivity of semiconductors, wherein it comprises:
a first assembly, said first assembly being a signal emission/reception system capable of emitting/receiving a multifrequency signal over a range of frequencies,
a second assembly, said second assembly comprising one semiconducting target and an inductor element, the semiconducting target being positioned close to the inductor element,
one transmission line, said transmission line being adapted to transmit the signal between the first assembly and the second assembly,
a third assembly, said third assembly being intended to be connected to the first assembly, the third assembly comprising an analysis system, the third assembly being adapted to analyze an emitted signal and a reflected or transmitted signal received by the first assembly, and the third assembly being adapted to derive therefrom a reflection or transmission coefficient of the emitted signal;
and wherein the emitted multifrequency signal is of the, form:

$$x(t) = \sum_{i=1}^{N/2} a_i \cos\left(\frac{2\pi i}{NT_e}t + \varphi_i\right)$$

where $T_e$ is the period of each sample of the emitted multicarrier signal, $a_i$ the amplitude of each frequency composing the multicarrier signal, and $\varphi_i$ its respective phase.

12. The device for contactless measurement according to claim 11, wherein the inductor element is printed on a circuit board, said circuit board being positioned near the semiconducting target.

13. The device for contactless measurement according to claim 11, wherein the inductor element is a coil having an inner radius and an outer radius, and wherein the semiconducting target extends along two dimensions in a plane perpendicular to a main direction of the inductor element, the inner and outer radii of the inductor element being smaller than the dimensions of the semiconducting target.

* * * * *